(12) United States Patent
Cok

(10) Patent No.: US 7,893,612 B2
(45) Date of Patent: Feb. 22, 2011

(54) LED DEVICE HAVING IMPROVED LIGHT OUTPUT

(75) Inventor: Ronald S. Cok, Rochester, NY (US)

(73) Assignee: Global OLED Technology LLC, Herndon, VA (US)

(*) Notice: Subject to any disclaimer, the term of this patent is extended or adjusted under 35 U.S.C. 154(b) by 154 days.

(21) Appl. No.: 12/037,961

(22) Filed: Feb. 27, 2008

(65) Prior Publication Data

US 2009/0212694 A1    Aug. 27, 2009

(51) Int. Cl.
*H01J 1/62* (2006.01)
*H01J 63/04* (2006.01)

(52) U.S. Cl. .............. 313/506; 313/498; 313/512; 313/112; 313/113

(58) Field of Classification Search ......... 313/498–512, 313/112, 113
See application file for complete search history.

(56) References Cited

U.S. PATENT DOCUMENTS

| | | | |
|---|---|---|---|
| 5,554,911 A | 9/1996 | Nakayama et al. | |
| 5,949,197 A | 9/1999 | Xu et al. | |
| 6,384,529 B2 | 5/2002 | Tang et al. | |
| 6,570,584 B1 | 5/2003 | Cok et al. | |
| 6,680,570 B2 | 1/2004 | Roitman et al. | |
| 6,861,800 B2 | 3/2005 | Tyan et al. | |
| 6,987,355 B2 | 1/2006 | Cok | |
| 7,030,553 B2 | 4/2006 | Winters et al. | |
| 7,230,594 B2 | 6/2007 | Cok et al. | |
| 7,622,865 B2* | 11/2009 | Kobayashi | 313/506 |
| 2005/0225232 A1* | 10/2005 | Boroson et al. | 313/504 |
| 2005/0225233 A1* | 10/2005 | Boroson et al. | 313/504 |
| 2006/0066228 A1 | 3/2006 | Antoniadis et al. | |
| 2006/0192220 A1 | 8/2006 | Nishikawa et al. | |
| 2007/0015429 A1* | 1/2007 | Maeda et al. | 445/24 |
| 2007/0257609 A1* | 11/2007 | Fukuda et al. | 313/506 |
| 2009/0051283 A1* | 2/2009 | Cok et al. | 313/506 |
| 2009/0051284 A1* | 2/2009 | Cok et al. | 313/506 |
| 2009/0085478 A1* | 4/2009 | Cok et al. | 313/506 |
| 2009/0091238 A1* | 4/2009 | Cok et al. | 313/498 |
| 2009/0102352 A1* | 4/2009 | Cok et al. | 313/498 |

* cited by examiner

*Primary Examiner*—Joseph L Williams
*Assistant Examiner*—Kevin Quarterman
(74) *Attorney, Agent, or Firm*—Morgan, Lewis & Bockius LLP

(57) ABSTRACT

A light-emitting diode device that includes a first group of sub-pixels each subpixel comprising a reflective electrode and a second electrode formed over a substrate with an unpatterned light-emitting layer formed between the reflective electrode and the second electrode, thus forming a first optical cavity having a first cavity length. Either the reflective or second electrode is patterned to form two or more independently-controllable, light-emitting sub-pixels. A second group of sub-pixels, each comprising a reflective electrode and a second electrode formed over the substrate. An unpatterned light-emitting layer is formed between the reflective electrode and the second electrode to comprise a second optical cavity having a second cavity length different from the first cavity length of the first optical cavity. Either the reflective or second electrode is patterned to form one or more independently-controllable, light-emitting sub-pixels.

19 Claims, 5 Drawing Sheets

LED DEVICE HAVING IMPROVED LIGHT OUTPUT

The present invention relates to light-emitting diode (LED) devices, and more particularly, to LED device structures for improving light output efficiency, improved power distribution, and reduced manufacturing costs.

BACKGROUND OF THE INVENTION

Emissive flat-panel display devices are widely used in conjunction with computing devices and in particular with portable devices. These displays are often used in public areas with significant ambient illumination and are viewed from a wide variety of angles.

Light emitting diodes (LED) incorporating thin films of organic or inorganic light-emitting materials have many advantages in a flat-panel display device and are useful in optical systems. U.S. Pat. No. 6,384,529 issued May 7, 2002 to Tang et al. shows an OLED color display that includes an array of organic LED light-emitting elements (pixels). Light is emitted from a pixel when a current is passed through an organic material, the frequency of the light is dependent on the nature of the organic material used. The organic materials are placed upon a substrate between electrodes, with an encapsulating cover layer or plate. In such a display, light can be emitted through the substrate (a bottom emitter) or through the encapsulating cover (a top emitter), or both. The emitted light is Lambertian, that is it is emitted equally in every direction. Because LED devices employ high-optical-index emissive materials, a large fraction (e.g. greater than 50%) of the emitted light is trapped in the device due to total internal reflection and thus reduces the device efficiency. Inorganic materials, for example, may include phosphorescent crystals or quantum dots. Other thin films of organic or inorganic materials may also be employed to control charge injection, transport, or blocking to the light-emitting-thin-film materials, and are known in the art.

LED devices can comprise a patterned light-emissive layer wherein different materials are employed in the pattern to emit different colors of light when current passes through the materials. However, patterning the materials, particularly for small-molecule organic LED materials is difficult for large-size substrates, thereby increasing manufacturing costs. Moreover, existing patterning methods, for example employing metal shadow masks, are expensive and can damage deposited organic materials. One approach to overcoming material deposition problems on large substrates is to employ a single emissive layer, for example, a white-light emitter, together with color filters for forming a full-color display, as is taught in U.S. Pat. No. 6,987,355 entitled, "Stacked OLED Display having Improved Efficiency" by Cok. It is also known to employ a white sub-pixel that does not include a color filter, for example, as taught in U.S. Pat. No. 6,919,681 entitled, "Color OLED Display with Improved Power Efficiency" by Cok et al. A design employing an unpatterned white emitter has been proposed together with a four-color pixel comprising red, green, blue color filters and sub-pixels and an unfiltered white sub-pixel to improve the efficiency of the device (see, e.g. U.S. Pat. No. 7,230,594). However, these disclosures do not address the problem of large amounts of trapped light.

Regardless of the light-emitting layer structure, area LED devices suffer from trapped light in the light-emitting layer, due to the relatively high index of the emission layer compared to air. Optical cavity structures are known to increase the light emitted from an OLED device structure. Such optical cavity structures are also known as microcavities or optical microcavities when formed in thin films. When formed in LED devices, different color light-emitting organic materials are pattern-wise deposited over a substrate between a reflective electrode and a semi-transparent electrode. Light emitters having different colors are thus formed within an optical cavity tuned to a desired peak wavelength of light, typically corresponding to the color of light emitted by the patterned organic materials. U.S. Pat. No. 6,680,570 describes an organic light-emitting device with improved color control employing spacer layers to form an optical cavity. FIG. 5 illustrates such a prior-art, active-matrix, bottom-emitting optical cavity device employing a substrate 10 with active-matrix thin-film electronic components 30, planarization structures 32 and 34, and a semi-transparent electrode 16. Patterned organic materials 14R, 14G, and 14B, providing red, green, and blue light emission, are deposited in a light-emitting layer 14. Optical spacers 26R, 26G, and 26B are employed to form optical cavities 60, 62, and 64 tuned to the desired peak wavelengths of red, green, and blue light, respectively to emit red light 80, green light 82, and blue light 84. A cover 20 can be employed to protect and encapsulate the device. While such designs are useful, they require a patterned organic material deposition technology (for example, vacuum deposition through metal shadow-masks) that is difficult to scale to large substrates.

To overcome the cost of patterned deposition, one can employ an unpatterned broadband (e.g. white) emitting layer for all sub-pixels, together with color filters for three color sub-pixels and an unfiltered, fourth white emitter, as noted above. However, the problem of trapped light remains. If a microcavity design employing tuned microcavities for each colored emitter is employed to extract trapped light, the fourth emitter will no longer emit white light, due to the frequency selection inherent in optical cavity structures. The loss of a white emitter reduces the efficiency of the unpatterned device. Furthermore, the construction of optical cavities tuned to the color of each emitter can be expensive, requiring multiple manufacturing steps.

U.S. Pat. No. 5,554,911 entitled, "Light-emitting elements" describes a multi-color light-emitting element having at least two optical cavity structures with respectively different optical lengths determining their emission wavelengths. Each optical cavity structure includes an organic material as a light-emitting region, which may be a single film of uniform thickness in the element. U.S. Pat. No. 6,861,800 entitled, "Tuned microcavity color OLED display" describes a microcavity OLED device having an array of pixels divided into at least two different color pixel sets, each color pixel set emitting a different predetermined color light over a common substrate, wherein each pixel in the array includes a metallic bottom-electrode layer disposed over the substrate and a metallic electrode layer spaced from the metallic bottom-electrode layer. The material for the semi-transparent metallic electrode layer includes Ag, Au, or alloys thereof. The thickness of the semi-transparent metallic electrode layer, the combined thickness of the organic layers, and the transparent conductive phase-layer; and also the placement of the light-emitting layer are selected so that each pixel in the display forms a tuned microcavity OLED device having emission output efficiency above that of a comparable OLED device without the microcavity. U.S. Pat. No. 5,949,187 describes an OLED with a first microcavity including a first transparent spacer and a first mirror stack positioned on the first spacer to reflect light back into the OLED and to define an optical length of the first microcavity. The optical length of the first microcavity is such that light emitted from the first microcavity has a first spectrum. A second microcavity includes a second transparent spacer positioned adjacent the first microcavity and a second mirror stack positioned on the second spacer reflects light toward the second OLED and defines an optical length of the second microcavity. The optical length of the second microcavity is such that light emitted from the second microcavity has a second spectrum. Additional microcavities can be placed in the structure to further enhance and alter the light spectrum. Such designs, however, do not address the need for reduced manufacturing costs and increased efficiency.

US 2006/0066228 A1 entitled, "Reducing or eliminating color change for microcavity OLED devices", by Antoniadis discloses a microcavity OLED device that minimizes or eliminates color change at different viewing angles. The OLED device can be, for example, an OLED display or an OLED light source used for area illumination. This OLED device includes a multi-layer mirror on a substrate, and each of the layers is comprised of a non-absorbing material. The OLED device also includes a first electrode on the multi-layered first mirror, and the first electrode is substantially transparent. An emissive layer is on the first electrode. A second electrode is on the emissive layer, and the second electrode is substantially reflective and functions as a mirror. The multi-layer mirror and the second electrode form a microcavity. On a front surface of the substrate is a light modulation thin film. The light modulation thin film can be any one of: a cut-off color filter, a band-pass color filter, a brightness enhancing film, a microstructure that attenuates an emission spectrum at an angle at which there is a perceived color change, or a microstructure that redistributes wavelengths so the outputted emission spectrums have the same perceived color. Again, such designs may have increased manufacturing costs due to patterned deposition processes. Also, significant light may be absorbed by the color filters thereby, reducing efficiency.

U.S. Pat. No. 7,030,553 entitled, "OLED device having microcavity gamut sub-pixels and a within gamut sub-pixel" by Winters et al, discloses an example of a prior-art microcavity device. This disclosure describes an OLED device including an array of light-emitting pixels, each pixel including sub-pixels having organic layers including at least one emissive layer that produces light and includes spaced electrodes. There are at least three gamut sub-pixels that produce colors that define a color gamut and at least one additional sub-pixel that produces light within the color gamut produced by the gamut sub-pixels. At least one of the gamut sub-pixels includes a reflector and a semitransparent reflector, which function to form a microcavity. However, this design employs a patterned semi-transparent electrode that can be difficult to manufacture in a top-emitting format. U.S. Pat. No. 6,570,584 entitled, "Broad Color Gamut Display" by Cok et al describes a digital color image display device, including a plurality of pixels, each pixel having a plurality of sub-pixels with at least one of the sub-pixels producing a color other than red, green, or blue. However, there is no teaching of improving device efficiency. US 2006/0192220 describes a bottom emitter device having a patterned reflection film to form both light-emitting regions having a microcavity and light-emitting regions without a microcavity. This particular structure requires a patterned reflection film, thereby increasing costs. The structure is also not useful for unpatterned light-emitting layers.

There still remains a need, therefore, for an improved light-emitting structure that overcomes shortcomings in the prior art and that increases the light output and reduces manufacturing costs of an LED device, such as a display.

SUMMARY OF THE INVENTION

The need is met in one embodiment of the present invention by providing a light-emitting diode device that includes a first group of sub-pixels each subpixel comprising a reflective electrode and a second electrode formed over a substrate with an unpatterned light-emitting layer formed between the reflective electrode and the second electrode, thus forming a first optical cavity having a first cavity length. Either the reflective or second electrode is patterned to form two or more independently-controllable, light-emitting sub-pixels. A second group of sub-pixels, each comprising a reflective electrode and a second electrode formed over the substrate. An unpatterned light-emitting layer is formed between the reflective electrode and the second electrode to comprise a second optical cavity having a second cavity length different from the first cavity length of the first optical cavity. Either the reflective or second electrode is patterned to form one or more independently-controllable, light-emitting sub-pixels.

ADVANTAGES

The present invention has the advantage that it increases the light output, color gamut, and reduces the costs of an LED device.

It will be understood that the figures are not to scale since the individual layers are too thin and the thickness differences of various layers too great to permit depiction to scale.

DETAILED DESCRIPTION OF THE INVENTION

Figure 1:
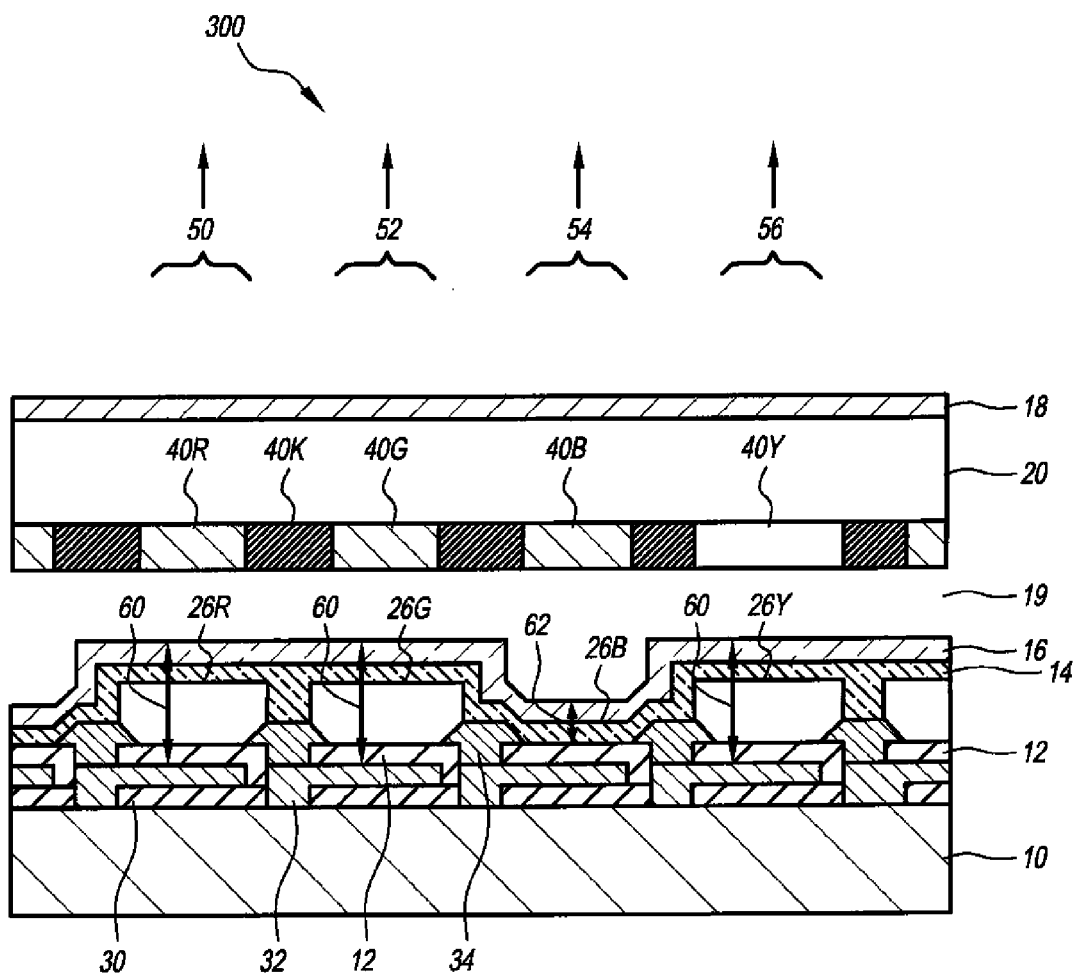
FIG. 1 illustrates a partial cross section of a top-emitter LED device according to an embodiment of the present invention.

Referring to FIG. 1, an exemplary embodiment of a light-emitting diode device 300 according to the present invention comprises a first group of sub-pixels (e.g. 50, 52, 56) each comprising a reflective electrode 12 and a second electrode 16 formed over a substrate 10 with an unpatterned light-emitting layer 14 formed between the reflective electrode 12 and the second electrode 16 to comprise a first optical cavity 60 having a first cavity length, and wherein either the reflective 12 or second electrode 16 is patterned to form two or more independently-controllable, light-emitting sub-pixels (e.g. 50, 52, 56). A second group of sub-pixels (e.g. 54) each comprising a reflective electrode 12 and a second electrode 16 formed over the substrate 10 with the unpatterned light-emitting layer 14 formed between the reflective electrode 12 and the second electrode 16 to comprise a second optical cavity 62 having a second cavity length different from the first cavity length of the first optical cavity 60. Either the reflective 12 or second electrode 16 is patterned to form one or more independently-controllable, light-emitting sub-pixels. As shown in FIG. 1, for example, reflective electrode 12 is patterned. The independently-controllable light-emitting elements can be controlled, for example by thin-film electronic components 30 formed on the substrate 10. Insulating and planarization layers 32 and 34 may be employed to form smooth surfaces on which to deposit the materials of the light-emitting layer 14 and to electrically isolate the plurality of independently-controllable electrodes (e.g. 12). The other electrode (e.g. 16) can be unpatterned and electrically common to all of the light-emitting sub-pixels 50, 52, 54, 56. The plurality of independently-controllable, light-emitting sub-pixels are divided into only first and second groups each having a different optical cavity (60, 62) with a different optical cavity length. The plurality of independently-controllable, light-emitting sub-pixels 50, 52, 54, 56 in the groups comprise a pixel; a plurality of pixels are formed over the substrate 10 to form a pixellated light-emitting diode (LED) device 300, e.g. a display.

The unpatterned, light-emitting layer 14 can include multiple layers, including charge-control layers and multiple light-emitting layers. Optical spacers 26R, 26G, 26B and 26Y can be included in the optical cavities, but according to the present invention, form only two different optical cavity lengths (60, 62). As shown in FIG. 1, for example, the optical cavity lengths for sub-pixels 50, 52, and 56 have a first optical cavity length 60 while sub-pixel 54 has a second optical cavity length that is different from the first optical cavity length.

As illustrated in FIG. 1 in one embodiment of the present invention, the reflective electrode 12 is located between the substrate 10 and the second electrode 16 to form a top-emitting LED device. According to various embodiments of the present invention, the locations of the reflective electrode 12 and the second electrode 16 can be reversed to provide a bottom-emitting LED device wherein the second electrode 16 is between the substrate 10 and the reflective electrode 12, and the substrate 10 is transparent.

In one embodiment of the present invention, the second electrode 16 is semi-transparent and comprises, for example, thin layers of metals such as aluminum or silver, or metal alloys that, in combination with the reflective electrode 12, form an optical cavity. In various other embodiments of the present invention, the second electrode 16 is transparent and the LED device further comprises a low-index layer 19 adjacent the second electrode 16; and having an optical index lower than the optical index of the second, transparent electrode 16. Such a low-index layer 19 can be present even when the second electrode 16 is semi-transparent, rather than transparent. As demonstrated by applicants, the combination of a transparent second electrode comprising a relatively high-optical-index material, e.g. indium tin oxide or aluminum zinc oxide, and a relatively-low-optical index layer, e.g. air, other gases, or a vacuum, forms an optical cavity (e.g., comprising 12, 26R, 14, 16).

Figure 2:
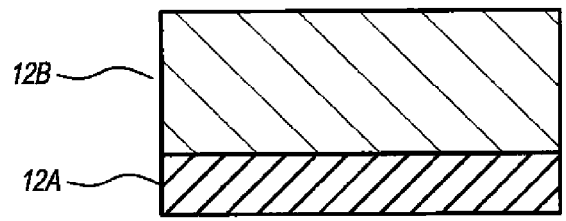
FIG. 2 illustrates a partial cross section of a bi-layer electrode according to an embodiment of the present invention.

Various optical spacers can be employed in various embodiments of the present invention. For example, transparent conductive organic materials such as NPB can be formed between the reflective and second electrodes 12, 16, of either the first or second group of sub-pixels (or both) to define the optical cavity length of the sub-pixels. Alternatively, transparent, conductive inorganic materials such as indium tin oxide can be formed over the reflective electrode 12 to form a spacer, or in combination with the second electrode 16 to form a spacer. Referring to FIG. 2, an electrode 12 or 16 may comprise two layers, 12A and 12B, wherein the layer 12B is a transparent conductive layer forming a layer of an electrode, e.g. reflective electrode 12 or second electrode 16, while the other layer, 12A, may be reflective or semi-transparent.

The light-emitting diode device 300 of the present invention can incorporate light-emitting layers comprising either, or both, organic materials (for example such as are found in OLED devices) and inorganic materials (for example, phosphorescent crystalline material or quantum dots in a polycrystalline semiconductor matrix). Charge-control layers may also be provided to further enhance the performance of the light-emitting layer.

Figure 3:
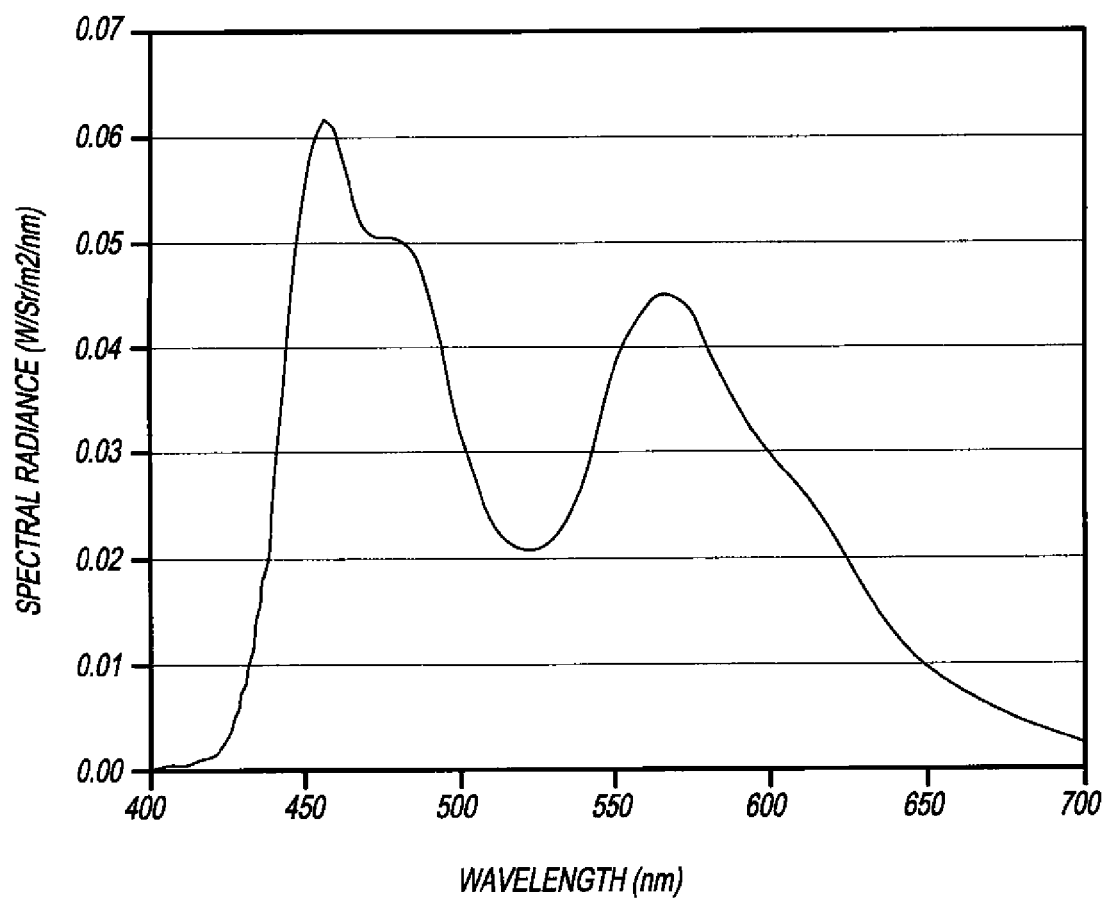
FIG. 3 is a graph illustrating the spectrum of a white emitter at a normal viewing angle without a microcavity structure useful in various embodiments of the present invention.

Because the present invention relies upon an unpatterned light-emitting layer and multiple sub-pixels having optical cavities with only two different lengths, it can be helpful to tune the optical cavities to frequencies complementary to the spectrum of light emitted by the unpatterned light-emitting layer. Referring to FIG. 3, applicants have constructed organic LED devices having a light-emitting layer that can emit white light having a spectrum with two peaks. In other embodiments, more than two peaks can be provided and have been demonstrated by applicant. The peak spectral frequencies may be matched to the resonant frequencies of the optical cavities of the sub-pixels. As shown in FIG. 3, the largest spectral peaks correspond to blue and yellow colors. Alternatively, the largest spectral peaks can correspond to cyan and red colors. In some embodiments of the present invention, the largest two spectral peaks correspond to complementary colors so that the combined emission of the peaks appears white.

In further embodiments of the present invention and as shown in FIG. 1, color filters 40R, 40G, and an optional blue color filter 40B are located in correspondence with one or more of the independently-controllable, light-emitting sub-pixels to filter the light emitted by the independently-controllable, light-emitting sub-pixels. A fourth color filter 40Y may, or may not, be included. Generally, it is preferred that the fourth sub-pixel be as efficient as possible to improve the efficiency of the device as much as possible. Hence, a color filter may not be employed. Moreover, it can be useful for the fourth sub-pixel to emit white light. If any of the colored sub-pixels have sufficient color purity without the color filter, the color filter may not be used, thereby increasing the efficiency of that sub-pixel.

In the embodiment illustrated in FIG. 1, the first group includes independently-controllable, light-emitting sub-pixels having a color filter (e.g. 40R) of a first color (e.g. red) and also includes independently-controllable, light-emitting sub-pixels having a second color filter (e.g. 40G) of a second color (e.g. green) different from the first color. Moreover, the first group includes independently-controllable, light-emitting sub-pixels having a color filter (e.g. 40R or 40G) of a first color (e.g. red or green) and the second group includes independently-controllable, light-emitting sub-pixels having a second optional color filter (e.g. 40B) of a second color (e.g. blue) different from the first color. The fourth sub-pixel emits yellow light. In some circumstances, applicants have found that the blue color filter may not be needed, since the optical cavity effect is strong enough to provide a sufficiently pure blue color.

Applicants have demonstrated the present invention using a white-light-emitting layer that emits light having the spectrum illustrated in FIG. 3. By employing a first cavity tuned to the emission wavelength of the yellow peak and employing that cavity for the red, green, and fourth subpixels, together with color filters over the red and green sub-pixels to purify the emitted color and the fourth sub-pixel without a color filter and employed to improve the device efficiency, a device with an overall efficiency greater than that of a similar, non-optical-cavity device can be constructed.

Figure 7:
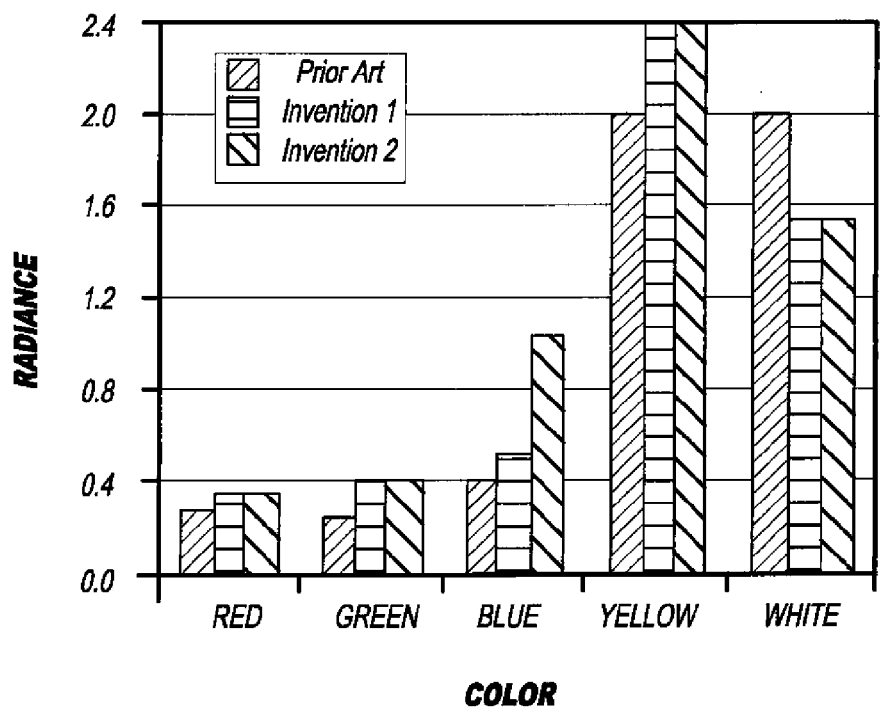
FIG. 7 is a graph comparing the radiance of an embodiment of the present invention with a prior art implementation.
Figure 8:
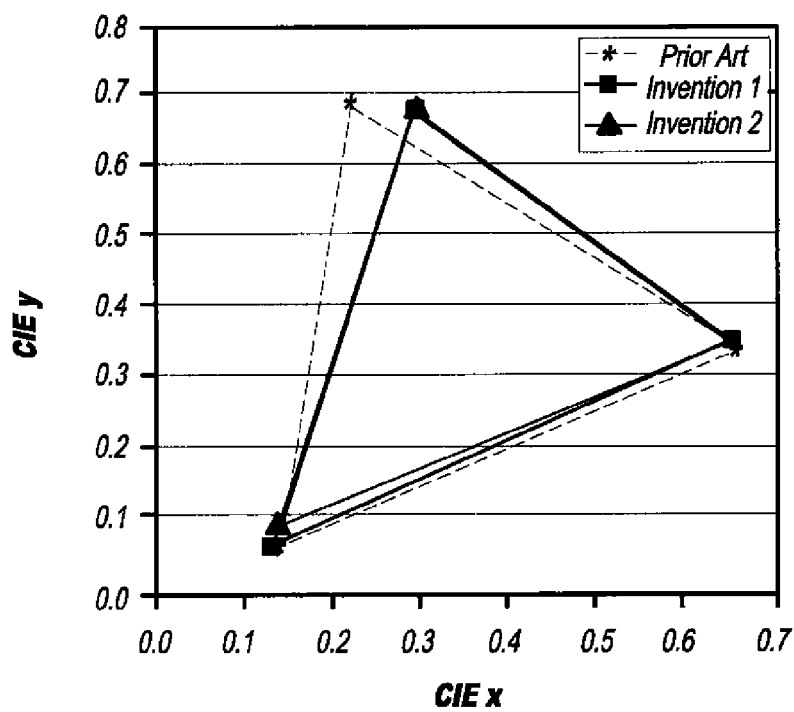
FIG. 8 is a graph comparing the color gamut of an embodiment of the present invention with a prior art implementation.

Referring to FIGS. 7 and 8, the results of an experiment are graphed. In these graphs, an RGBW prior-art design is compared to a two-cavity RGBY device of the present invention as illustrated in FIG. 1, both employing a common unpatterned light-emitting layer emitting white light with the dual-peak spectrum shown in FIG. 3. In the cavity device, the spectral peaks (blue and yellow) of the light-emitting layer match the resonant frequency of the optical cavities. The reflective electrode comprises a thick (e.g. 100 nm) layer of aluminum while the second electrode is a semi-transparent, 20 nm-thick silver electrode. Invention 1 includes a blue color filter over the blue sub-pixel while Invention 2 does not.

It can be seen from FIG. 7 that for both of the two inventive experiments, the efficiency of the color sub-pixels is much improved, especially for the green. In the second inventive case, the blue emission is greatly improved. The yellow emission in both cases is the same and is also greater than the white emission. However, if the yellow emitter is combined with the blue (as described below) to provide a white point matched to that of the prior art comparison, the efficiency is reduced. FIG. 8 illustrates the color gamut. The red and blue emitters for the prior-art and experiment 1 are nearly the same. However, the color of the blue emitter for the second invention (without a blue color filter) suffers somewhat. In both inventive cases, the green color of the inventions is not as good as the prior art.

As can be seen from these graphs, by employing the present invention, saturated colors can be produced much more efficiently, with only some loss of color gamut in the green. By employing a thicker green filter (and reducing the efficiency of the green emission) a comparable color gamut can be achieved while maintaining an advantage in efficiency. For a device employing only red, green, and blue sub-pixels, the present invention will provide an advantage. In the case of a device employing red, green, blue, and white sub-pixels the comparison is somewhat more complex. If the same white point is desired for the inventive cases, the blue emitter is required to compensate for the white, resulting in the efficiency indicated for the white in FIG. 6. Modeling by applicants indicates that the efficiency advantage is greater for saturated colors than for neutral colors, depending on the amount of white employed in the neutrals.

While additional cavities tuned to the desired frequencies may be employed in an RGBY device, thereby increasing the radiance and efficiency of the sub-pixels (e.g. tuning additional cavities to the desired red and green frequencies) such additional cavities are costly, in that additional manufacturing steps must be employed to form the cavities. Hence the present invention provides improved efficiency performance with a smaller increase in manufacturing costs than a cavity device employing more cavities. At the same time, if a semi-transparent electrode is employed, the benefits of an unpatterned top electrode with improved power distribution are also obtained.

Figure 4:
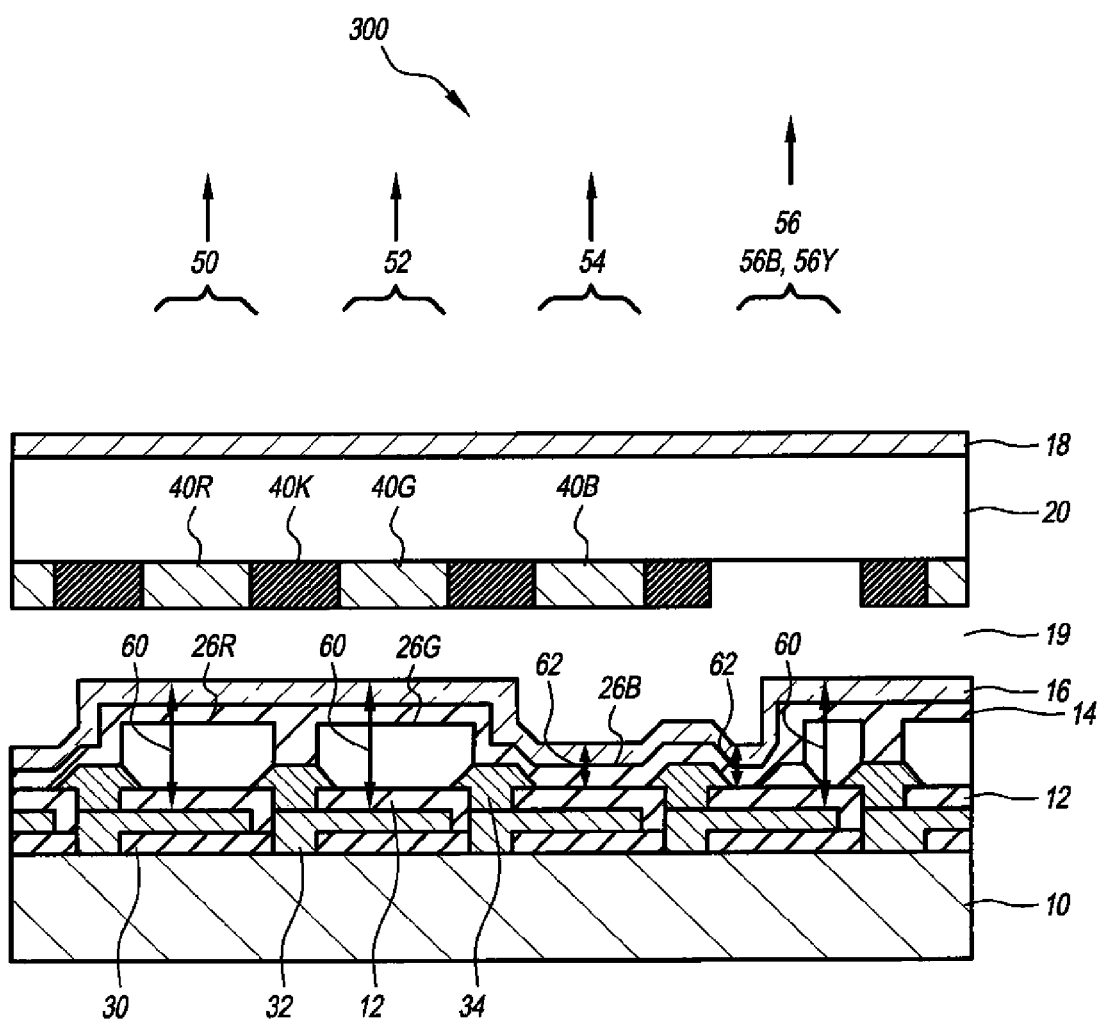
FIG. 4 illustrates a partial cross section of a top-emitter LED device having a sub-pixel with two, different optical cavities according to an alternative embodiment of the present invention.
Figure 5:
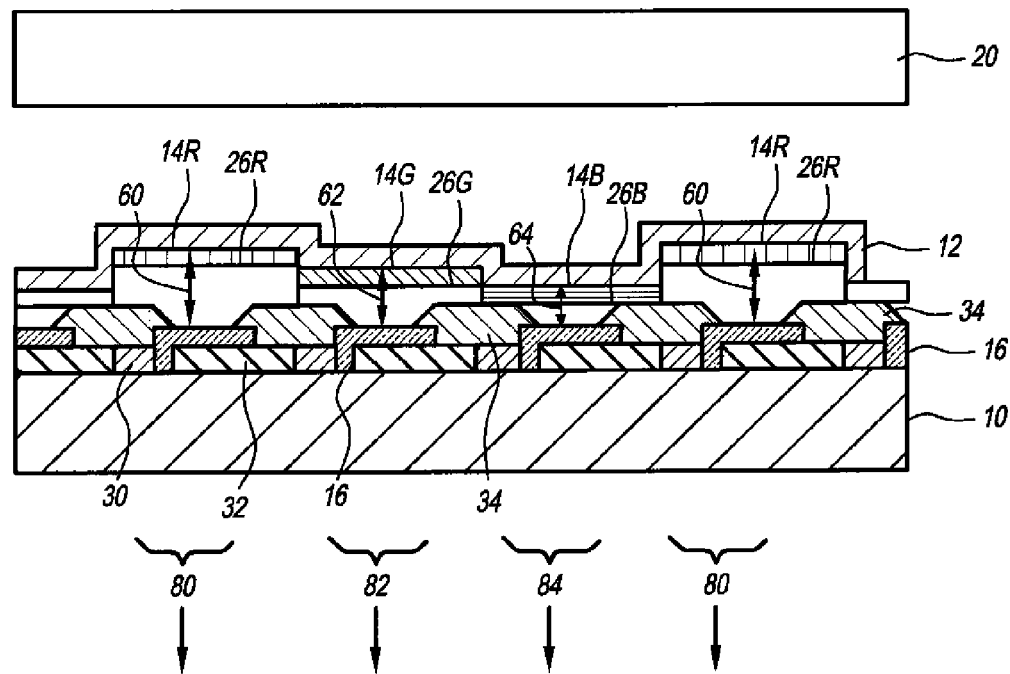
FIG. 5 illustrates a partial cross section of a prior-art bottom-emitter LED device.

While the present invention can provide improved performance with a fourth, additional sub-pixel that emits light of a single color, according to an additional embodiment of the present invention, the fourth sub-pixel may comprise two optical cavities, rather than one. The two optical cavities, together, emit light that may more readily be perceived as white since the two optical cavities may be tuned to frequencies that are complementary (e.g. blue and yellow or red and cyan). Hence, referring to FIG. 4, one independently-controllable, light-emitting sub-pixel 56 has a first optical cavity in a first portion 56B of the independently-controllable, light-emitting sub-pixel and a second optical cavity in a second portion 56Y of the independently-controllable, light-emitting sub-pixel 56 and wherein light from the first and second optical cavities have different complementary colors and the independently-controllable, light-emitting sub-pixel emits perceptually white light. Thus, the independently-controllable, light-emitting sub-pixel 56 has one portion in the first group and a second portion in the second group. Such a structure is explicitly contemplated and included in the present invention.

As employed in the present invention, a pixel is a multi-color picture element comprising three or more sub-pixels, each sub-pixel includes an independently-controlled light emitter emitting light of a different color. Typically, pixels include red, green, and blue sub-pixels (an RGB configuration). In addition, as employed in this disclosure, an independently-controllable sub-pixel is also included in each pixel (e.g. a yellow emitter in an RGBY configuration or a double-cavity structure emitting white light in an RGBW configuration). When a yellow sub-pixel is employed in an RGBY configuration, if the yellow or white sub-pixel has a greater luminous efficacy than at least one of the red, green, or blue sub-pixels (as will generally be true due to the lack of a color filter over the yellow sub-pixel and a more efficient emitter) increased brightness or reduced power utilization is obtained for images containing regions having low-to-moderate color saturation (i.e. having a significant gray component). The light-emitting elements 50, 52, 54, 56 correspond to sub-pixels.

The present invention thus employs an RGBY (red, green, blue, and yellow) or RGBW (red, green, blue, and white) sub-pixel architecture to form individual pixels in an information presentation device, such as an electronic display. A common, unpatterned white-light emitting layer 14 is employed. Colored light is formed by a combination of two separately tuned microcavities together with color filters 40R, 40G (for the color sub-pixels) and an optional cavity for the blue sub-pixel 54. A black matrix 40K can be employed to absorb ambient light between the light-emitting elements 50, 52, 54, 56. Planarizing and insulating layers 32 and 34 can be provided to electrically separate the independently-controllable light-emitting elements.

In this disclosure, complementary wavelengths of light are those wavelengths of light that, when viewed together, form a substantially white-appearing light such as light on or near the Planckian locus. For example, blue and yellow form a complementary pair, as do cyan and red, and magenta and green. According to various exemplary embodiments of the present invention, the sub-pixels may form pixels in a display wherein the sub-pixels are not individually distinguished by eye at a design viewing distance. Hence, the light emitted from the primary and complementary sub-pixels (e.g. 54, 56 in FIG. 1) will be viewed as white by a typical human eye, even though the light emitted is actually a combination of complementary colors.

In actual operation, current, for example, as supplied through thin-film transistors 30, passes through the light-emitting layer 14 via the electrodes 12 and 16, causing light to be emitted. Some of the emitted light passes directly out of the device or through the color filters and out of the device. Other light is reflected from the reflective electrode 12 and passes out of the device. Other light, emitted at a higher angle to the normal, is trapped via total internal reflection. The optical cavity structures serve to reduce the angle of emission of the emitted light, thereby reducing the amount of trapped light, improving color purity, and also focusing more of the desired light in the forward direction, e.g, providing a 20% increase in radiance. The present invention may be employed with both active-matrix and passive-matrix control circuits.

A large variety of white-light emitters can be employed with the present invention and a variety of microcavities can be formed to create white light-emitting elements from these white-light emitters. In some embodiments of the present invention, the light-emitting layer 14 contains materials for emitting light having at least two emission peaks (e.g. a primary color and a color complementary to the primary color such as blue and yellow). These emission peaks can be located at frequencies that correspond to the desired colors of light emitted by the first and second sub-pixels to optimize emission efficiency. Likewise, the optical cavities can be tuned to the same frequencies as can the color filters, where present. In alternative embodiments of the present invention (not shown), the light-emitting layer 14 contains materials for emitting light having at least three emission peaks and the emission peaks can be located at frequencies that correspond to the colors of light emitted by the first, second and third subpixels or to the primary colors used by the device. In yet other alternative embodiments of the present invention, the light-emitting layer 14 contains materials for emitting light having at least four emission peaks and the emission peaks can be located at frequencies that correspond to the colors of light emitted by the first, second, third and fourth subpixels (not shown). In these various embodiments, it is generally the case that multi-peak, broad-band emission is perceived as substantially white light and the unpatterned, light-emitting layer is a white-light-emitting layer.

The light emission from devices of the present invention may be further controlled by employing different luminance ratios for the various sub-pixels. Since, in typical organic light-emitting diode systems (OLEDs), yellow emitters are more efficient than blue, it can be advantageous to increase the size of the blue emitter relative to the yellow. Likewise, in the example provided, green is more efficient than red, so the red sub-pixel may have a larger area relative to the green. By matching the relative light-emitting areas of the differently-colored sub-pixels, matched current densities may be obtained and a more-consistent lifetime achieved among the pixels.

Matching the spectrum of the emissive material, the color filter peak transmissions, and the optical microcavity response increases the light emission from the optical cavities of the present invention. That is, the optical cavities of the colored sub-pixels may be tuned to an approximate peak wavelength corresponding to the peak transmission wavelength of the corresponding color filter by changing the optical path length of the cavity. Likewise, the optical microcavities of the white sub-pixels are tuned to one or more peak wavelengths approximately corresponding to the peak emission wavelengths of the white-light-emitting layer. Similarly, the peak emission wavelengths of the white-light-emitting layer are matched to the peak transmission wavelength of the corresponding color filter.

A variety of light-emissive materials can be employed in the present invention. For example, the white-light-emitting layer includes organic materials such as small-molecule organic or polymer materials or inorganic quantum dots formed in a poly-crystalline semiconductor matrix. Conventional photolithographic techniques are employed to form control structures (e.g. busses, transistors, capacitors, electrodes) on a substrate as well as forming transparent layers suitable for defining optical cavities. Suitable cavity-defining transparent materials can include, for example, silicon dioxide or indium tin oxide, or organic materials. Organic materials are deposited by various means known in the art, for example, vacuum evaporation. However, such means preferably provide sufficient precision and accuracy to enable the consistent manufacturing of the optical cavities. In particular, the Kodak Vapor Injection System™ is a linear, organic vacuum evaporation source providing deposition of organic layers to within 1% uniformity and accuracy that can be usefully employed. Suitable semi-transparent cathodes are formed by evaporation or sputter techniques known in the art, for example of silver, magnesium, aluminum or other metals or metal alloys. These semi-transparent electrodes will typically have a reflectance of greater than 20% and will ideally have an absorbance of less than 10%. Encapsulation techniques for both organic and inorganic materials useful for the present invention are known in the art. The present invention can be employed with various elements, such as circular polarizers (18 in FIG. 1), suitable for improving device ambient contrast ratio. In one embodiment, the present invention is a top-emitter device, as shown in FIG. 1. In an alternative embodiment, (not shown) the device is a bottom-emitter device.

Figure 6:
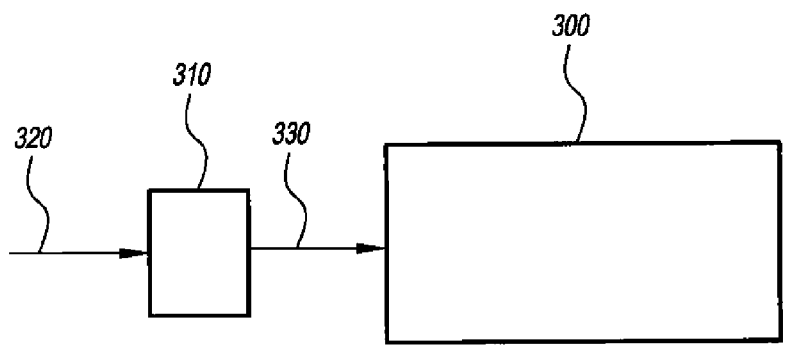
FIG. 6 is a schematic diagram illustrating an information-display display system according to an embodiment of the present invention.

Referring to FIG. 6, the present invention can be employed in an information-display system having an LED display device 300 (shown in greater detail in FIG. 1) and a controller 310 for receiving information signals 320 (e.g. text, and images). The controller 310 processes the signals 320 to form a converted signal 330 suitable for driving display device 300

In a patterned device, different materials are employed to emit light of different colors in response to a current. In contrast, in an unpatterned device, the same materials are employed to emit a single color, for example, white, and the light emitted by the color sub-pixels is subsequently colored by employing color filters and optical cavities in combination with the white-light emitter. Often, a white-light emitter will include a combination of materials in one or more unpatterned layers that each emit a different color, for example, blue and yellow or red and cyan, to emit a light that is perceived, overall, to be white. According to the present invention, however, many light-emitting materials are included in a single layer, or however many layers are included, the layers are unpatterned and their aggregate emission employed in all of the sub-pixels in all of the pixels. All of these layer combinations are included in the present invention and are considered a part of the light-emitting layer 14.

It is known in the prior art that, in LED devices, light is trapped by total internal reflection in the high-optical-index layers that actually emit light, or high-optical index charge-control layers, or high-optical index transparent electrodes. Light emitted at low angles to the normal is emitted from the device, while light emitted at a relatively higher angle to the normal can be trapped in the high-optical-index layers. By employing an optical cavity structure, the emission of light at high angles is reduced so that more light is emitted from the device at relatively lower angles to the normal.

Applicants have physically constructed numerous OLED devices employing microcavities, both with patterned, colored emitters and with white emitters and have studied their performance together with the performance of circular polarizers and color filters. Moreover, optical modeling tools have been employed to understand the performance of the present invention under a variety of circumstances. In general, a white-light-emitting, unpatterned OLED device employing an optical cavity and color filters can be expected to roughly double the light output of the colored pixels in comparison to a white-light-emitting, unpatterned OLED device without an optical cavity and color filters. However, since the sub-pixels that do not employ a color filter are more efficient and the complementary sub-pixel is also more efficient than at least one of the primaries (and more often two or all of the primaries), the use of a complementary or white sub-pixel improves the overall performance of an OLED device as most images have few saturated colors and the more-efficient complementary light emitter is used disproportionately.

Further details with regard to the use of circular polarizers and color filters are disclosed in commonly-assigned, co-pending U.S. application Ser. Nos. 11/842,221 and 11/842,229 and are hereby incorporated by reference in their entirety.

LED devices of this invention can employ various well-known optical effects in order to enhance their properties, if desired. This includes optimizing layer thicknesses to yield maximum light transmission, providing dielectric mirror structures, providing anti-glare or anti-reflection coatings over the display, providing neutral density, or providing color conversion filters over the display. Filters, polarizers, and anti-glare or anti-reflection coatings can be specifically provided over or as part of the cover or substrate.

The present invention can be practiced with either active- or passive-matrix OLED devices, and is particularly useful in information-display devices. In a preferred embodiment, the present invention is employed in a flat-panel OLED device composed of small-molecule or polymeric OLEDs as disclosed in, but not limited to U.S. Pat. No. 4,769,292, issued Sep. 6, 1988 to Tang et al., and U.S. Pat. No. 5,061,569, issued Oct. 29, 1991 to VanSlyke et al. Inorganic devices, for example, employing quantum dots formed in a polycrystalline semiconductor matrix (for example, as taught in US Publication 2007/0057263 by Kahen), and employing organic or inorganic charge-control layers, or hybrid organic/inorganic devices can be employed. Many combinations and variations of organic or inorganic light-emitting displays can be used to fabricate such a device, including both active- and passive-matrix displays having either a top- or bottom-emitter architecture.

The invention has been described in detail with particular reference to certain preferred embodiments thereof, but it should be understood that variations and modifications can be effected within the spirit and scope of the invention.

PARTS LIST 10 substrate
12 reflective electrode
12A reflective layer
12B transparent, conductive spacer layer
14 light-emitting layer(s)
14R, 14G, 14B patterned light-emitting layers
16 transparent or semi-transparent electrode
18 circular polarizer
19 low-index layer
20 cover
26 spacers
26R, 26G, 26B, 26Y spacer
30 thin-film circuitry
32 insulator
34 insulator
40R, 40G, 40B, 40Y color filter
40K black matrix
50, 52, 54, 56 light-emitting elements, sub-pixels
56B, 56Y sub-pixel portion
60, 62, 64, optical cavity
80, 82, 84 light
300 device
310 controller
320 signal
330 converted signal

The invention claimed is:

1. A light-emitting diode device, comprising:
   a) a first group of differently colored sub-pixels each comprising a reflective electrode and a second electrode formed over a substrate with an unpatterned light-emitting layer formed between the reflective electrode and the second electrode to comprise a first optical cavity having a first cavity length, and wherein either the reflective or second electrode is patterned to form two or more independently-controllable, differently colored light-emitting sub-pixels; and
   b) a second group of sub-pixels each comprising the reflective electrode and the second electrode formed over the substrate with the unpatterned light-emitting layer formed between the reflective electrode and the second electrode to comprise a second optical cavity having a second cavity length different from the first cavity length of the first optical cavity, and wherein either the reflective or second electrode is patterned to form one or more independently-controllable, light-emitting sub-pixels,
   wherein the second electrode of either group is transparent and further comprising a low-index layer adjacent the second electrode having an optical index lower than the optical index of the second, transparent electrode.

2. The light-emitting diode device of claim 1, wherein the reflective electrode of either group is formed between the substrate and the second electrode of either group.

3. The light-emitting diode device of claim 1, wherein the second electrode of either group is formed between the substrate and the reflective electrode of either group.

4. The light-emitting diode device of claim 1 further comprising an optical spacer located between the reflective and second electrodes of the independently-controllable, light-emitting sub-pixels of either, or both, of the first or second group of light-emitting sub-pixels.

5. The light-emitting diode device of claim 4, wherein the optical spacer is a layer between the reflective and second electrodes.

6. The light-emitting diode device of claim 4, wherein either, or both, of the reflective or second electrodes of the independently-controllable, light-emitting sub-pixels in the first or second groups comprises a transparent, conductive layer forming an optical spacer.

7. The light-emitting diode device of claim 4, wherein the reflective and second electrodes and the unpatterned light-emitting layer comprise an organic light-emitting diode (OLED).

8. The light-emitting diode device of claim 1 further comprising color filters located in correspondence with one or more of the independently-controllable, light-emitting sub-pixels of either group to filter the light emitted by the independently-controllable, light-emitting sub-pixels.

9. The light-emitting diode device of claim 8, wherein the first group includes independently-controllable, light-emitting sub-pixels having a color filter of a first color and also includes independently-controllable, light-emitting sub-pixels having a second color filter of a second color different from the first color.

10. The light-emitting diode device of claim 8, wherein the first group includes independently-controllable, light-emitting sub-pixels having a color filter of a first color and the second group includes independently-controllable, light-emitting sub-pixels having a second color filter of a second color different from the first color.

11. The light-emitting diode device of claim 8, wherein either the first or second group includes independently-controllable, light-emitting sub-pixels having a color filter and also includes sub-pixels having no color filter.

12. The light-emitting diode device of claim 1, wherein the unpatterned light-emitting layer emits white light having a spectrum with at least two peaks.

13. The light-emitting diode device of claim 12, wherein the two largest spectral peaks are blue and yellow or cyan and red.

14. The light-emitting diode device of claim 1, wherein the independently-controllable, light-emitting sub-pixels in one group emit red and green light and the sub-pixels in the other group emit blue light.

15. The light-emitting diode device of claim 14, wherein the independently-controllable, light-emitting sub-pixels in the group that emits red and green light also include sub-pixels that emit yellow light.

16. The light-emitting diode device of claim 14, wherein the independently-controllable, light-emitting sub-pixels that emit red and green light include red and green color filters, respectively.

17. The light-emitting diode device of claim 14, wherein the independently-controllable, light-emitting sub-pixels that emit blue light include blue color filters.

18. The light-emitting diode device of claim 1, further comprising an independently-controllable, light-emitting sub-pixel having the first optical cavity in a first portion of the independently-controllable, light-emitting sub-pixel and the second optical cavity in a second portion of the independently-controllable, light-emitting sub-pixel and wherein light from the first and second optical cavities have different complementary colors and the independently-controllable, light-emitting sub-pixel emits perceptually white light.

19. The light-emitting diode device of claim 14, wherein the independently-controllable, light-emitting sub-pixels in the group that emits red and green light also include sub-pixels that emit substantially white light by having two different complementary colors.

* * * * *